US012763748B2

(12) United States Patent
Hong et al.

(10) Patent No.: US 12,763,748 B2
(45) Date of Patent: Oct. 13, 2026

(54) MICROWAVE HEAT TREATMENT APPARATUS AND IMPEDANCE MATCHING METHOD

(71) Applicant: SEMES CO., LTD., Cheonan-si (KR)

(72) Inventors: Hak Gyun Hong, Cheonan-si (KR); Jong Seok Lee, Cheonan-si (KR); Seong Rok Joe, Cheonan-si (KR); Gi Jae Yoon, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 17 days.

(21) Appl. No.: 18/951,966

(22) Filed: Nov. 19, 2024

(65) Prior Publication Data

US 2025/0167751 A1 May 22, 2025

(30) Foreign Application Priority Data

Nov. 21, 2023 (KR) ........................ 10-2023-0162225

(51) Int. Cl.
*H03H 7/38* (2006.01)
*H01J 37/32* (2006.01)

(52) U.S. Cl.
CPC ......... *H03H 7/38* (2013.01); *H01J 37/32311* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,793,162 A * | 8/1998 | Barnes | H01J 37/32174 315/111.21 |
| 6,313,584 B1 * | 11/2001 | Johnson | H01J 37/32183 315/111.21 |
| 10,269,540 B1 * | 4/2019 | Carter | H01J 37/32183 |
| 10,395,897 B1 | 8/2019 | Wi et al. | |
| 2020/0126761 A1 | 4/2020 | Coumou | |
| 2021/0294218 A1 | 9/2021 | Fan et al. | |
| 2023/0377842 A1 * | 11/2023 | Bae | H01J 37/32926 |

FOREIGN PATENT DOCUMENTS

| | | |
|---|---|---|
| KR | 10-2015-0060567 | 6/2015 |
| KR | 10-2019-0039579 | 4/2019 |
| KR | 10-1989518 | 6/2019 |
| KR | 10-2021-0009360 | 1/2021 |

* cited by examiner

*Primary Examiner* — Kenneth B Wells

(57) ABSTRACT

Disclosed are a microwave heat treatment apparatus and an impedance matching method between a microwave power supply and a chamber in the microwave heat treatment apparatus. The impedance matching method includes the steps of initially adjusting the impedance of a tuner circuit between the microwave power supply and the chamber based on pre-matching data for a heat treatment process, applying microwave power to the chamber from the microwave power supply through the tuner circuit having the initially adjusted impedance, measuring process data related to the impedance of the chamber to which the microwave power has been applied, determining an impedance tuning value of the tuner circuit by comparing the process data and the pre-matching data, and adjusting the impedance of the tuner circuit based on the impedance tuning value.

16 Claims, 12 Drawing Sheets

( a ) ( b )

MICROWAVE HEAT TREATMENT APPARATUS AND IMPEDANCE MATCHING METHOD

The present application claims priority to Korean Patent Application No. 10-2023-0162225, filed Nov. 21, 2023, the entire contents of which is incorporated by reference herein for all purposes.

BACKGROUND

Technical Field

The present disclosure relates to a microwave heat treatment apparatus and an impedance matching method between a microwave power supply and a chamber in the microwave heat treatment apparatus.

Description of the Related Art

A semiconductor manufacturing process, which is a process for manufacturing a semiconductor device on a substrate (e.g., a wafer), includes, for example, exposure, deposition, etching, ion implantation, and cleaning. In order to perform each manufacturing process, semiconductor manufacturing equipment for performing each process is provided in a clean room of a semiconductor manufacturing plant, and the process is performed on a substrate introduced into the semiconductor manufacturing equipment.

In the semiconductor manufacturing process, processes using plasma, such as etching and deposition, are widely used. The plasma treatment process is performed by seating the substrate in a lower part of a plasma treatment space and applying voltage by an antenna located at an upper part of the plasma treatment space along with the supply of gas for plasma treatment. Meanwhile, technology in which microwaves are applied from above for heat treatment of the substrate is also being introduced.

A microwave heat treatment apparatus performs heat treatment on a substrate by applying microwave power from a microwave power supply located at an upper part thereof to a chamber in which the substrate is located. In order to efficiently transmit the microwave power to the chamber while minimizing reflected power, impedance matching between the microwave power supply and the chamber is required.

In order to achieve impedance matching, a tuner circuit is provided on an electrical path between the microwave power supply and the chamber. Generally, the tuner circuit measures reflected power of the power supplied to the chamber from the microwave power supply, determines an impedance tuning value at which the reflected power is minimized, and adjusts the impedance of the tuner circuit to match the impedance tuning value. Impedance adjustment is mainly performed using an element having impedance varied by mechanical manipulation. A mechanical vacuum capacitor, which is a variable capacitor having capacitance adjusted by a mechanical driving apparatus (e.g., a motor), may be used as the impedance variable element.

In the case of heat treatment using microwaves, the substrate is heated to a target temperature within 1 second at the earliest, but it takes 0.2 seconds to 0.6 seconds for measurement of the reflected power, calculation of the impedance tuning value, and operation of the driving apparatus for adjusting the impedance of the tuner circuit. Thus, when a conventional impedance matching method is applied in the microwave heat treatment apparatus, the impedance tuning process takes a long time compared to the overall process time, resulting in a decrease in power transmission efficiency.

SUMMARY

Therefore, the present disclosure has been made in view of the above problems, and it is an object of the present disclosure to provide a microwave heat treatment apparatus and an impedance matching method capable of quickly performing impedance matching.

The objects of the present disclosure are not limited to the aforementioned object, and other unmentioned objects will be clearly understood by a person having ordinary skill in the art to which the present disclosure pertains based on the following description.

In accordance with an aspect of the present disclosure, the above and other objects can be accomplished by the provision of an impedance matching method between a microwave power supply and a chamber in a microwave heat treatment apparatus, the impedance matching method including initially adjusting the impedance of a tuner circuit between the microwave power supply and the chamber based on pre-matching data for a heat treatment process, applying microwave power to the chamber from the microwave power supply through the tuner circuit having the initially adjusted impedance, measuring process data related to the impedance of the chamber to which the microwave power has been applied, determining an impedance tuning value of the tuner circuit by comparing the process data and the pre-matching data, and adjusting the impedance of the tuner circuit based on the impedance tuning value.

In the embodiment of the present disclosure, the pre-matching data may include a set of impedance tuning values corresponding to process conditions related to the heat treatment.

In the embodiments of the present disclosure, the process conditions may include the frequency of the microwave power supply, the height of a support pin configured to support a substrate in the chamber, and the temperature of the chamber.

In the embodiments of the present disclosure, the step of initially adjusting the impedance of the tuner circuit may include adjusting the impedance of the tuner circuit using one of the impedance tuning values included in the set.

In the embodiments of the present disclosure, the process data may include the height of the support pin configured to support the substrate in the chamber and the temperature of the chamber.

In the embodiments of the present disclosure, the step of determining an impedance tuning value for the tuner circuit by comparing the process data and the pre-matching data may include determining whether the process data is included in an internal division region of the pre-matching data, determining an impedance tuning value corresponding to the process data through regression analysis of the pre-matching data if the process data is included in the internal division region of the pre-matching data, and determining an impedance tuning value of the tuner circuit at which reflected power is minimized by measuring the reflected power from the chamber if the process data is included in an external division region of the pre-matching data.

In the embodiments of the present disclosure, the step of determining whether the process data is included within a range of the pre-matching data may include setting the internal division region based on points corresponding to the height of the support pin and the temperature of the chamber included in the pre-matching data and determining whether the point corresponding to the height of the support pin measured in the chamber and the temperature of the chamber is included in the internal division region.

In the embodiments of the present disclosure, the internal division region may be set by a convex hull algorithm or a concave hull algorithm.

In the embodiments of the present disclosure, the step of determining an impedance tuning value corresponding to the process data through regression analysis of the pre-matching data may include selecting points adjacent to the point corresponding to the measured height of the support pin and the measured temperature of the chamber and determining the impedance tuning value through weighted average of impedance tuning values corresponding to the points adjacent to the point.

In the embodiments of the present disclosure, the process data included in the external division region of the pre-matching data and the impedance tuning value of the tuner circuit at which the reflected power is minimized may be added to the pre-matching data.

In accordance with another aspect of the present disclosure, there is provided a microwave heat treatment apparatus including a chamber having a treatment space defined therein, a power supply device configured to supply thermal energy to the chamber, and a controller configured to control the power supply device. The power supply device includes a microwave power supply configured to provide thermal energy to the treatment space and a tuner circuit including a plurality of impedance elements provided on a power path between the chamber and the microwave power supply. The controller includes a processor configured to adjust the output of the microwave power supply and the impedance of the tuner circuit and a memory configured to store data related to matching of the tuner circuit. The processor initially adjusts the impedance of the tuner circuit based on pre-matching data for a heat treatment process stored in the memory, applies microwave power to the chamber from the microwave power supply through the tuner circuit having the initially adjusted impedance, measures process data related to the impedance of the chamber to which the microwave power has been applied, determines an impedance tuning value of the tuner circuit by comparing the process data and the pre-matching data, and adjusts the impedance of the tuner circuit based on the impedance tuning value.

In accordance with a further aspect of the present disclosure, there is provided a microwave heat treatment apparatus including a chamber having a treatment space for a substrate defined therein, a power supply device configured to supply thermal energy to the chamber, and a controller configured to control the power supply device. The power supply device includes a microwave power supply configured to provide thermal energy to the treatment space and a tuner circuit including a plurality of impedance elements provided on a power path between the chamber and the microwave power supply. The chamber includes a chuck installed at a lower part of the chamber, a support pin installed above the chuck, the support pin being configured to support the substrate, a temperature sensor configured to measure the temperature in the chamber, and a height sensor configured to measure the height of the support pin. The controller includes a processor configured to adjust the output of the microwave power supply and the impedance of the tuner circuit and a memory configured to store data related to matching of the tuner circuit. The processor initially adjusts the impedance of the tuner circuit based on pre-matching data including a set of impedance tuning values corresponding to process conditions related to heat treatment stored in the memory, the process conditions including the frequency of the microwave power supply, the height of the support pin configured to support the substrate in the chamber, and the temperature of the chamber, applies microwave power to the chamber from the microwave power supply through the tuner circuit having the initially adjusted impedance, measures process data including the height of the support pin and the temperature of the chamber from the height sensor and the temperature sensor, determines whether the point corresponding to the height of the support pin measured in the chamber and the temperature of the chamber is included in an internal division region set based on points corresponding to the height of the support pin and the temperature of the chamber included in the pre-matching data, determines an impedance tuning value corresponding to the process data through regression analysis of the pre-matching data if the process data is included in the internal division region of the pre-matching data, determines an impedance tuning value of the tuner circuit at which reflected power is minimized by measuring the reflected power from the chamber if the process data is included in an external division region of the pre-matching data, adjusts the impedance of the tuner circuit based on the impedance tuning value, and adds the process data included in the external division region of the pre-matching data and the impedance tuning value of the tuner circuit at which the reflected power is minimized to the pre-matching data and stores the pre-matching data having the impedance tuning value added thereto in the memory if the process data is included in the external division region of the pre-matching data.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
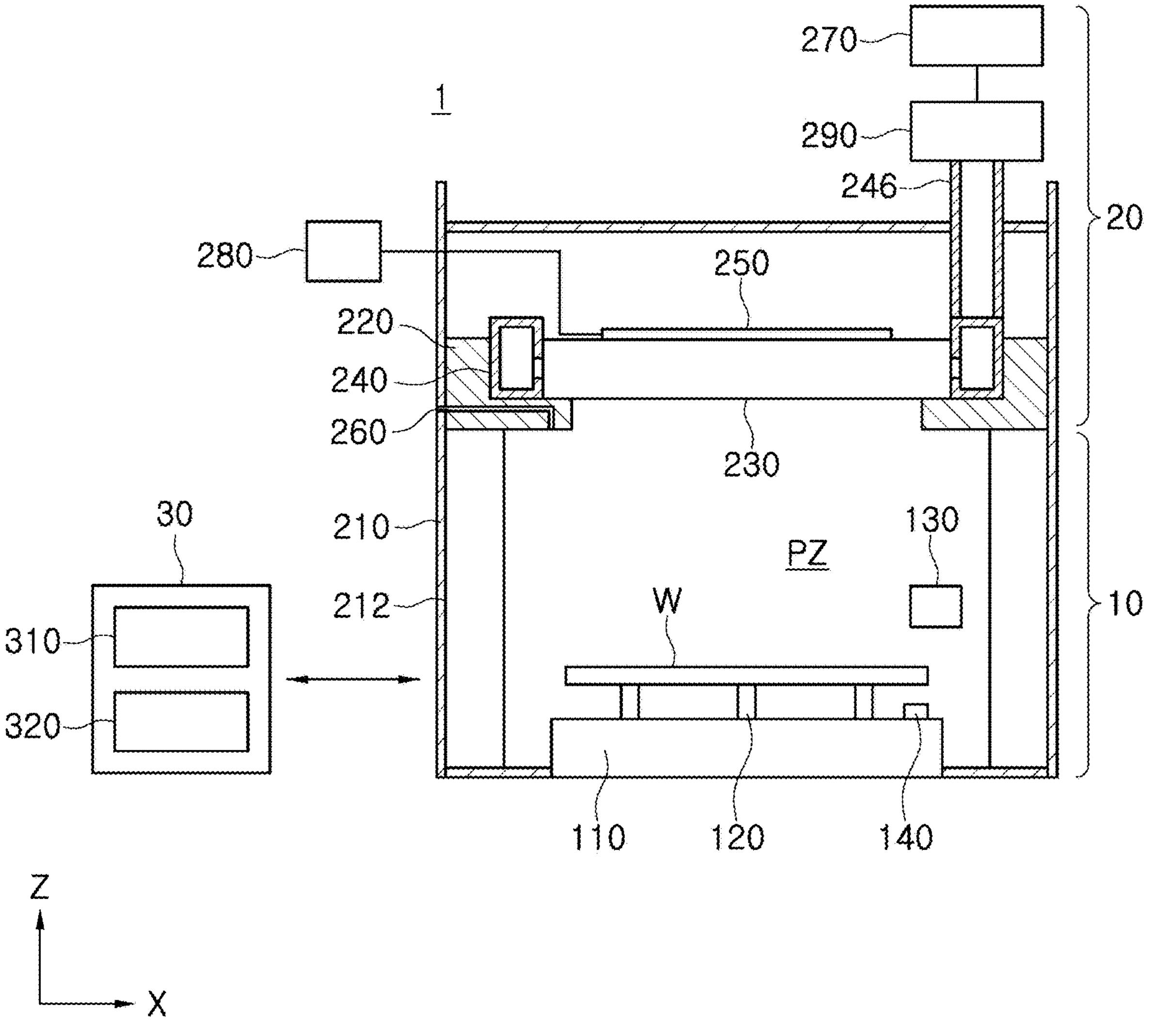
FIG. 1 shows a microwave heat treatment apparatus according to the present disclosure.

Hereinafter, embodiments of the present disclosure will be described in detail with reference to the accompanying drawings so that those skilled in the art can easily carry out the embodiments. The present disclosure may, however, be embodied in many different forms, and should not be construed as being limited to the embodiments set forth herein.

Parts irrelevant to description of the present disclosure will be omitted to clearly describe the present disclosure, and the same or similar constituent elements will be denoted by the same reference numerals throughout the specification.

In addition, constituent elements having the same configurations in several embodiments will be assigned with the same reference numerals and described only in the representative embodiment, and only constituent elements different from those of the representative embodiment will be described in the other embodiments.

Throughout the specification, when a constituent element is said to be "connected" or "coupled" to another constituent element, the constituent element and the other constituent element may be "directly connected" or "directly coupled" to each other, or may be "indirectly connected" or "indirectly coupled" to each other with one or more intervening elements interposed therebetween. In addition, throughout the specification, when a constituent element is referred to as "including" another constituent element, the constituent element should not be understood as excluding other elements, so long as there is no special conflicting description, and the constituent element may include at least one other element.

Unless otherwise defined, all terms used herein, which include technical or scientific terms, have the same meanings as those generally appreciated by those skilled in the art. The terms, such as ones defined in common dictionaries, should be interpreted as having the same meanings as terms in the context of pertinent technology, and should not be interpreted as having ideal or excessively formal meanings unless clearly defined in the specification.

The present disclosure relates to a microwave heat treatment apparatus 1 and an impedance matching method between a microwave power supply 270 and a chamber 10 in the microwave heat treatment apparatus 1, and more particularly to a microwave heat treatment apparatus 1 and an impedance matching method capable of performing impedance tuning at a high speed.

FIG. 1 shows a microwave heat treatment apparatus 1 according to the present disclosure. The microwave heat treatment apparatus 1 may perform a process for heating a substrate W using microwave power. In addition, the microwave heat treatment apparatus 1 may perform plasma treatment (e.g., dry etching and deposition) along with heat treatment of the substrate W. That is, the microwave heat treatment apparatus may alternately perform heat treatment of the substrate W and plasma treatment.

The microwave heat treatment apparatus 1 according to the embodiment of the present disclosure includes a chamber 10 having a treatment space PZ for the substrate W defined therein, a power supply device 20 configured to supply thermal energy to the chamber 10, and a controller 30 configured to control the power supply device 20.

The chamber 10 includes a chuck 110 installed at a lower part of the chamber 10 and a support pin 120 configured to support the substrate W above the chuck 110. In addition, the chamber 10 includes a height sensor 140 configured to measure the height of the support pin 120 and a temperature sensor 130 configured to measure the temperature of the treatment space PZ in the chamber 10.

The chuck 110, which is configured to support the substrate W, is located in the chamber 10, and the substrate W may be supported by the support pin 120 coupled to the chuck 110. A heater and a cooling channel configured to adjust the temperature of the substrate W may be formed in the chuck 110. In addition, a lower electrode configured to generate plasma in the treatment space PZ may be located in the chuck 110.

The support pin 120 supports the substrate W thereunder. Three or more support pins 120 may be provided to stably support the substrate W. The support pin 120 may be upwardly or downwardly moved by a driving mechanism (e.g., a motor) provided thereunder. That is, the height of the support pin 120 may be changed. The height of the support pin 120 may be determined to be a height at which heat treatment of the substrate W is optimized. A height sensor 140 configured to measure the height of the support pin 120 is installed in the vicinity of the support pin 120. The height sensor 140 may be a light sensor that is installed on the chuck 110 and measures the height of the support pin 120 by radiating light. Alternatively, the height sensor 140 may be a sensor that is mounted to a motor configured to upwardly or downwardly move the support pin 120 and measures the height of the support pin 120 based on the driving amount of the motor. The temperature sensor 130 measures the temperature of the treatment space PZ in the chamber 10. The data measured by the temperature sensor 130 and the height sensor 140 is provided to a processor 310. Temperature information measured by the temperature sensor 130 and height data measured by the height sensor 140 are subsequently included in process data.

Outside the microwave heat treatment apparatus 1, an inner space is formed by an outer wall 210, and the treatment space PZ of the chamber 10 is hermetically sealed by an inner support 212 provided inside the outer wall 210. In addition, the inner support 212 may support a support member 220 thereunder. The treatment space PZ is formed by the inner support 212, the support member 220, and a window 230.

The power supply device 20 includes a microwave power supply 270 configured to provide thermal energy to the treatment space PZ and a tuner circuit 290 including a plurality of impedance elements provided on a power path between the chamber 10 and the microwave power supply 270. The power supply device 20 applies power required for treatment of the substrate W in the treatment space PZ. The power supply device 20 may broadly include a plasma power supply device configured to apply power for forming a plasma and a microwave power supply device configured to apply microwaves for heat treatment of the substrate W.

The plasma power supply device may broadly include an upper electrode 250 and an RF power supply 280 configured to provide RF power to the upper electrode 250. Although not shown in detail, a matching circuit for impedance matching and a circuit for power transmission may be provided between the RF power supply 280 and the upper electrode 250. The upper electrode 250 may be disposed above the window 230. When treatment gas for treating the substrate W is supplied via a gas supply line 260, a plasma is formed in the treatment space PZ by the upper electrode 250 and the lower electrode provided at the chuck 110. The plasma formed by the plasma power supply device may etch a specific material of the substrate W.

The microwave power supply device provides power for heat treatment of the substrate W to the plasma treatment space PZ. The microwave power supply device may broadly include a microwave power supply 270, a tuner circuit 290, a microwave waveguide 246, and a microwave antenna 240. Microwaves generated by the microwave power supply 270 are transmitted to the microwave antenna 240 via the tuner circuit 290 and the waveguide 246.

The microwave antenna 240 may emit the microwaves into the treatment space PZ. The microwaves may also be emitted into a normal pressure space above the antenna, but heating by microwave absorption does not occur because a metal plate configured to reflect microwaves is located above the antenna. In this specification, microwaves refer to electromagnetic waves having a frequency band of 300 MHz to 300 GHz, which are shorter than radio waves and longer than infrared waves. Microwaves may be used to heat the substrate W because the microwaves have the property of penetrating specific materials while reacting with other specific materials.

The tuner circuit 290 includes a plurality of impedance elements provided on the power path between the chamber 10 and the microwave power supply 270. The tuner circuit 290 may adjust the impedance of an electrical path between the microwave power supply 270 and the chamber 10 such that the maximum power efficiency is achieved from the microwave power supply 270 to the chamber 10. The tuner circuit 290 may include a plurality of variable impedance elements (a variable capacitor and a variable inductor).

The controller 30 controls the overall operation of the microwave heat treatment apparatus 1. In particular, the controller 30 may adjust the output of the microwave power supply 270 and the impedance of the tuner circuit 290, and may store data necessary for operation of the microwave heat treatment apparatus 1. The controller 30 includes a processor 310 configured to adjust the output of the microwave power supply 270 and the impedance of the tuner circuit 290 and a memory 320 configured to store data related to matching of the tuner circuit 290. The impedance tuning method described below may be performed by the controller 30.

The processor 310 may perform computation and data processing for operation of the microwave heat treatment apparatus 1. The processor 310 may be constituted by one or more treatment circuits. The processor 310 may control the microwave heat treatment apparatus 1 by executing instructions configured to drive an operating system (OS) and associated programs of the microwave heat treatment apparatus 1. The processor 310 may be a central processing unit (CPU) or a dedicated processor designed for the microwave heat treatment apparatus 1.

The memory 320 stores data and instructions for operation of the microwave heat treatment apparatus 1. The memory 320 may be organized hierarchically. The memory 320 may include cache memory, volatile memory such as dynamic random access memory (DRAM), and non-volatile memory such as a solid state device (SSD) or hard disk drive (HDD).

Figure 2:
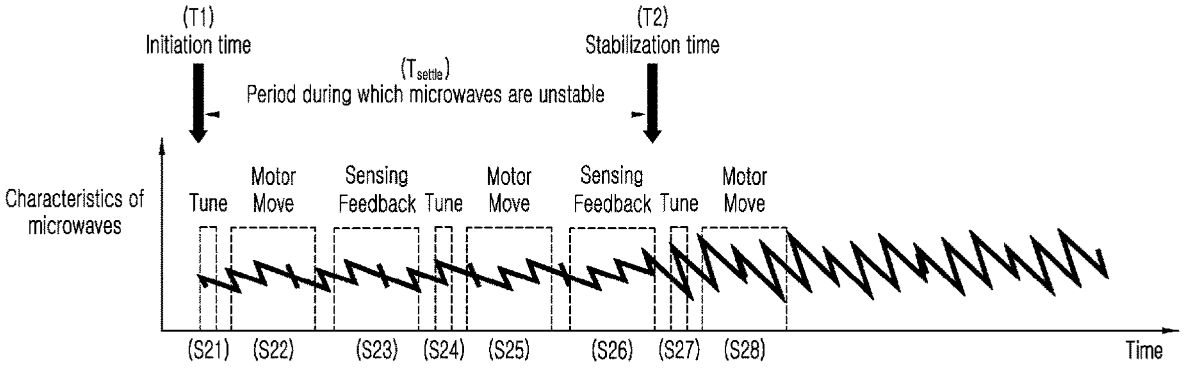
FIG. 2 Related Art
FIG. 2 is a view illustrating a conventional impedance matching process.

FIG. 2 is a view illustrating a conventional impedance matching process. FIG. 2 shows the microwave characteristics of the chamber 10 over time and an impedance matching step based thereon. In FIG. 2, microwaves are unstable in the chamber 10 for a certain period of time Tsettle after power is applied to the chamber 10 from the microwave power supply 270. In the conventional impedance matching process, a step of calculating a tuning value for impedance matching (S21), a step of adjusting the impedance of the variable element to match the tuning value (S22), and a step of detecting feedback due to the impedance adjustment (S23) are performed. Subsequently, a step of calculating a tuning value for impedance matching again (S24), a step of adjusting the impedance of the variable element to match the tuning value (S25), and a step of detecting feedback due to the impedance adjustment (S26) are performed. After the microwaves are stabilized in the chamber 10, a step of calculating a tuning value for impedance matching (S27) and a step of adjusting the impedance of the variable element to match the tuning value (S28) are performed. During the time when the microwaves are unstable (Tsettle), the transmission characteristics of the microwaves change rapidly due to a change in impedance of the tuner circuit 290 in addition to variability of the microwaves transmitted to the chamber 10.

In the steps of adjusting the impedance (S22, S25, and S28), the processor 310 operates the motor (the driving mechanism) to adjust the variable impedance element to match the calculated impedance tuning value. In the steps of detecting feedback (S23 and S26), an operation to measure the reflected power level according to the changed impedance of the tuner circuit 290 is performed. The heat treatment time of the substrate using microwaves generally takes 1 second to 3 seconds, and since it takes 0.2 seconds to 0.6 seconds to measure the reflected power level and drive the motor for impedance adjustment, it takes too much time for impedance matching. The present disclosure provides an impedance matching method capable of shortening the time for impedance matching in the heat treatment process for the substrate W using microwaves.

Figure 3:
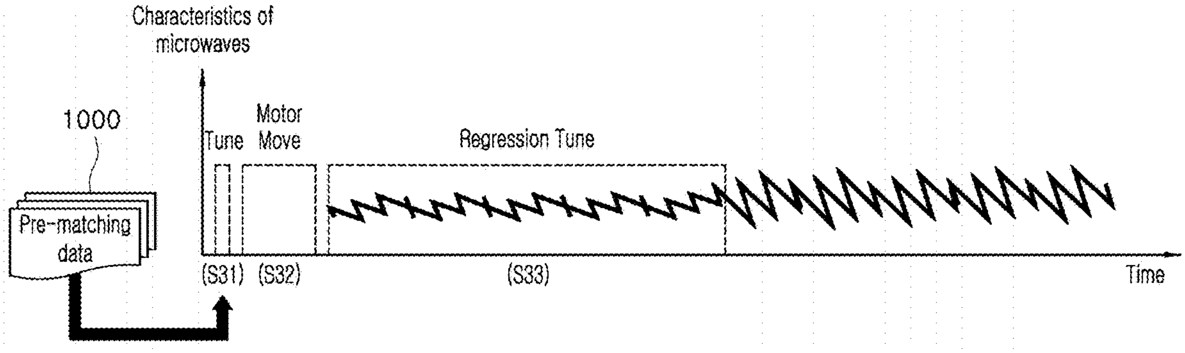
FIG. 3 is a view illustrating an impedance matching process according to the present disclosure.

FIG. 3 is a view illustrating an impedance matching process according to the present disclosure. According to the present disclosure, impedance matching by the tuner circuit 290 may be performed before microwaves are applied to the chamber 10. Referring to FIG. 3, a step of determining an impedance tuning value based on pre-matching data 1000 before microwaves are applied to the chamber 10 (S31) and a step of adjusting the impedance of the tuner circuit 290 to match the impedance tuning value (S32) are performed. The pre-matching data 1000 includes a set of impedance tuning values set for each process condition. The processor 310 may measure the current process conditions of the chamber 10, determine an impedance tuning value for the current process conditions using the pre-matching data 1000, and pre-adjust the impedance of the tuner circuit 290. Subsequently, microwave power generated by the microwave power supply 270 is applied to the chamber 10, and the processor 310 may perform impedance matching (S33) based on regression analysis using the pre-matching data 1000.

Regression analysis is a method of predicting future values based on previously learned or measured values. Models for regression analysis may vary, and, for example, linear regression may be used. According to the present disclosure, the processor 310 may determine an impedance tuning value for the current process based on process condition-specific impedance tuning data (pre-matching data) obtained through multiple processes. In this case, the time required for impedance tuning may be reduced compared to the case in which the reflected power is fed back to determine an impedance matching value, as in conventional impedance matching.

Figure 4:
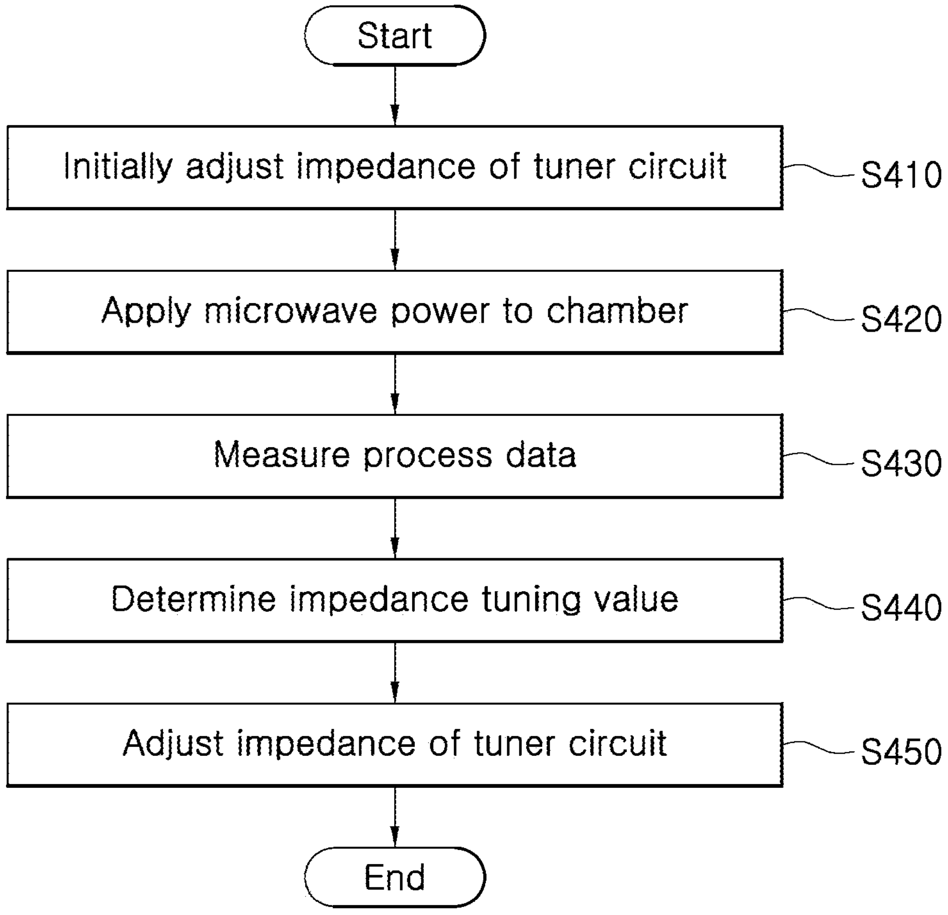
FIG. 4 is a flowchart showing an impedance matching method according to the present disclosure.

FIG. 4 is a flowchart showing an impedance matching method according to the present disclosure. The impedance matching method according to the present disclosure may be performed in the microwave heat treatment apparatus 1 by the processor 310. The impedance matching method between the microwave power supply 270 and the chamber 10 in the microwave heat treatment apparatus 1 according to the present disclosure includes a step of initially adjusting the impedance of the tuner circuit 290 between the microwave power supply 270 and the chamber 10 based on the pre-matching data 1000 for the heat treatment process (S410), a step of applying microwave power to the chamber 10 from the microwave power supply 270 through the tuner circuit 290 having the initially adjusted impedance (S420), a step of measuring process data related to the impedance of the chamber 10 to which the microwave power has been applied (S430), a step of determining an impedance tuning value of the tuner circuit by comparing the process data and the pre-matching data (S440), and a step of adjusting the impedance of the tuner circuit 290 based on the impedance tuning value (S450).

Figure 5:
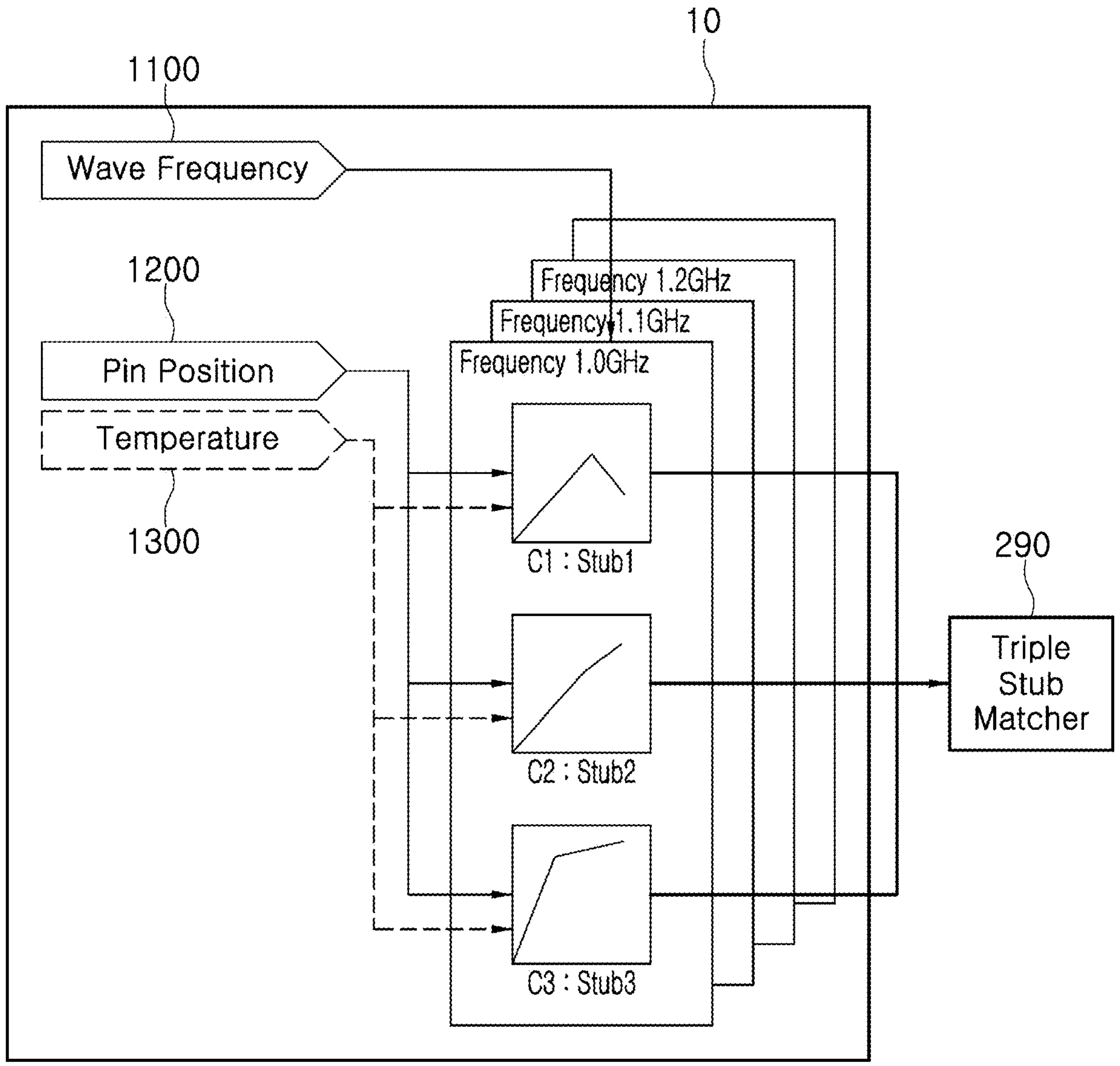
FIG. 5 is a visual representation of pre-matching data.

In step S410, the processor 310 initially adjusts the impedance of the tuner circuit 290 between the microwave power supply 270 and the chamber 10 based on the pre-matching data 1000 for the heat treatment process. The pre-matching data 1000 includes a set of impedance tuning values corresponding to process conditions related to the heat treatment. The process conditions include the frequency 1100 of the microwave power supply 270, the height 1200 of the support pin 120, which supports the substrate in the chamber 10, and the temperature 1300 of the chamber 10. FIG. 5 is a visual representation of the pre-matching data. Referring to FIG. 5, impedance matching tuning values C1, C2, and C3 based respectively on the frequency 1100, the height 1200 of the support pin 120, and the temperature 1300 of the chamber 10 are defined. In this specification, the impedance matching tuning values are the optimal impedance values for the microwave power supply 270 and the chamber 10, i.e., target impedance values of the tuner circuit 290. The processor 310 may obtain information about the process conditions of the chamber 10 prior to the process, determine an impedance tuning value for the process conditions from the pre-matching data 1000, and adjust the impedance of the tuner circuit 290 based on the impedance tuning value. The processor 310 may use an impedance tuning value that is most similar to the current process conditions in the pre-matching data. That is, the step of initially adjusting the impedance of the tuner circuit 290 (S410) may include a step of adjusting the impedance of the tuner circuit 290 using one of the impedance tuning values included in the set of impedance tuning values.

In step S420, the processor 310 applies microwave power to the chamber 10 from the microwave power supply 270 through the tuner circuit 290 having the initially adjusted impedance. The processor 310 may drive the microwave power supply 270 such that microwave power is supplied to the chamber 10 through the tuner circuit 290 having the impedance initially adjusted in step S410.

In step S430, the processor 310 measures process data related to the impedance of the chamber 10 to which the microwave power has been applied. The process data includes the height of the support pin 120, which supports the substrate W in the chamber 10, and the temperature of the chamber 10. The processor 310 may obtain the height of the support pin 120 measured by the height sensor 140 and the temperature of the chamber 10 measured by the temperature sensor 130.

In step S440, the processor 310 may determine an impedance tuning value of the tuner circuit 290 by comparing the process data to the pre-matching data 1000. After initial impedance matching, the processor 310 acquires the process data while the microwave power is applied to the chamber 10, and compares the process data to the pre-matching data 1000 to determine an impedance tuning value for further impedance tuning.

Figure 6:
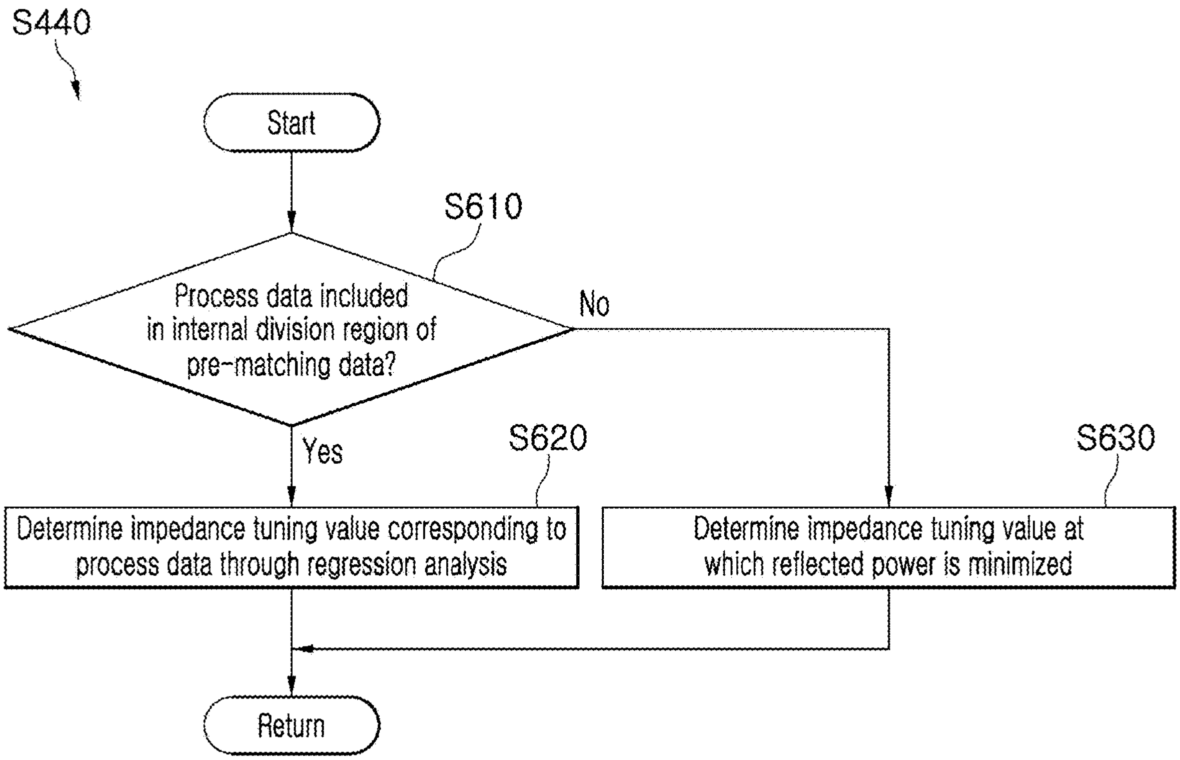
FIG. 6 is a flowchart showing a process for determining an impedance tuning value.

FIG. 6 is a flowchart showing a process for determining an impedance tuning value. The step of determining an impedance tuning value for the tuner circuit 290 by comparing the process data and the pre-matching data 1000 (S440) includes a step of determining whether the process data is included in an internal division (ID) region of the pre-matching data 1000 (S610), a step of determining an impedance tuning value corresponding to the process data through regression analysis of the pre-matching data 1000 if the process data is included in the internal division (ID) region of the pre-matching data 1000 (S620), and a step of determining an impedance tuning value of the tuner circuit 290 at which reflected power is minimized by measuring the reflected power from the chamber 10 if the process data is included in an external division (ED) region of the pre-matching data 1000 (S630).

In step S610, the processor 310 determines whether the process data is included in the internal division (ID) region of the pre-matching data 1000.

Figure 7:
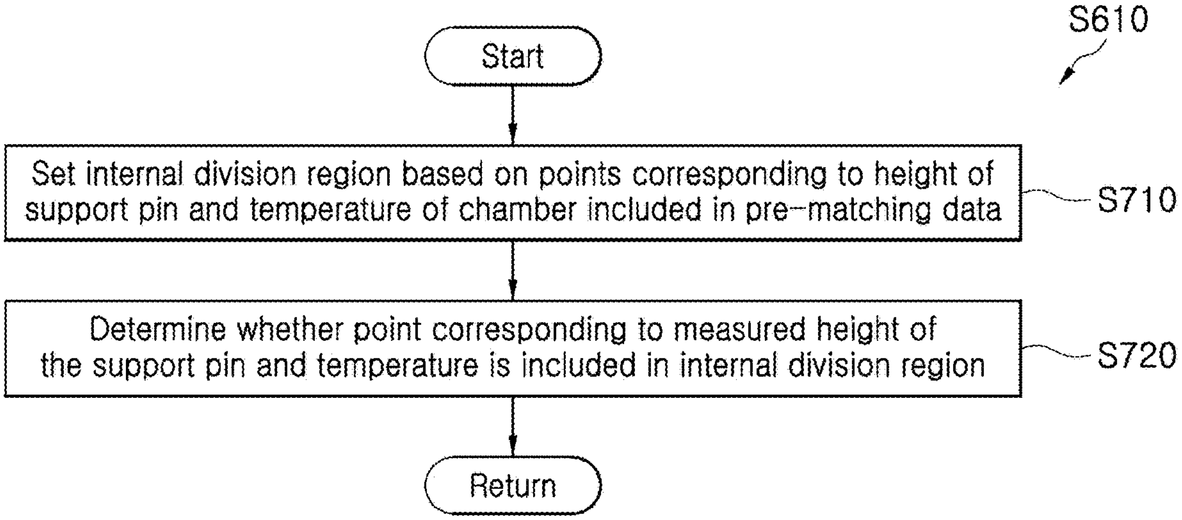
FIG. 7 is a flowchart showing a process for determining whether process data is included in an internal division region of the pre-matching data.

FIG. 7 is a flowchart showing a process for determining whether the process data is included in the internal division (ID) region of the pre-matching data. The step of determining whether the process data is included within the range of the pre-matching data 1000 (S610) includes a step of setting the internal division (ID) region based on points corresponding to the height of the support pin 120 and the temperature of the chamber 10 included in the pre-matching data 1000 (S710) and a step of determining whether a measured point SP1 corresponding to the height of the support pin 120 measured in the chamber 10 and the temperature of the chamber 10 is included in the internal division (ID) region (S720).

Figure 9:
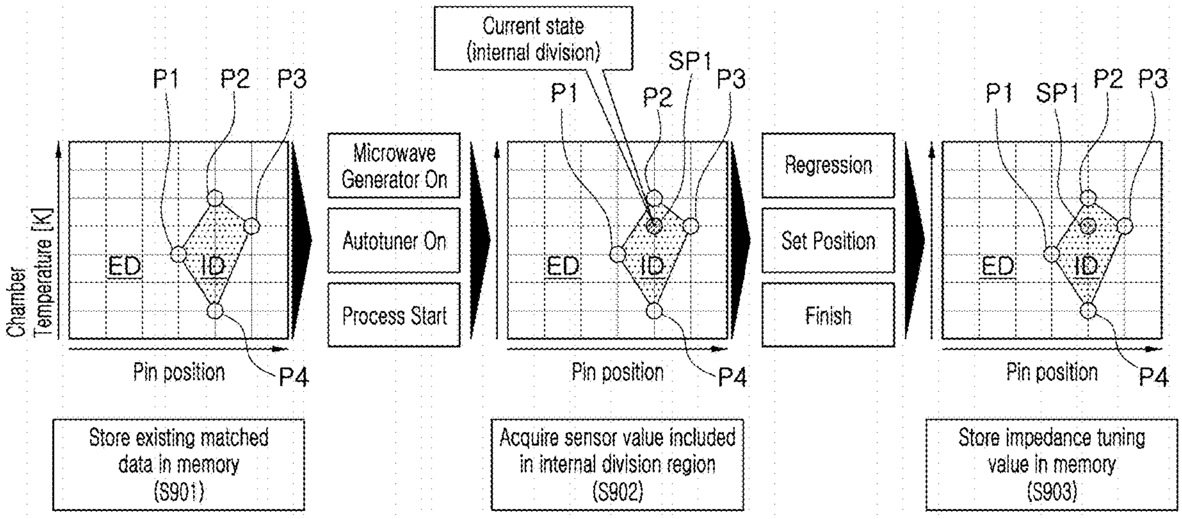
FIG. 9 is a view illustrating an impedance matching process when measured process data is included in the internal division region of the pre-matching data.
Figure 10:
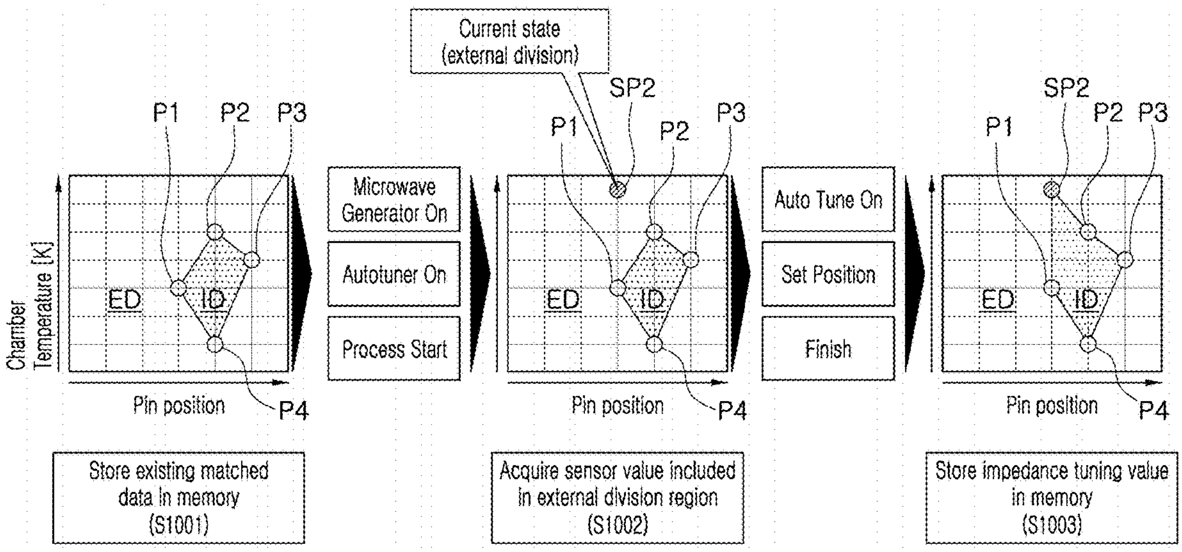
FIG. 10 is a view illustrating an impedance matching process when the measured process data is included in an external division region of the pre-matching data.

FIG. 9 is a view illustrating an impedance matching process when the measured process data is included in the internal division region of the pre-matching data, and FIG. 10 is a view illustrating an impedance matching process when the measured process data is included in the external division region of the pre-matching data. The pre-matching data 1000 includes impedance matching tuning values C1, C2, and C3 based on the height 1200 of the support pin 120 and the temperature 1300 of the chamber 10. The internal division (ID) region is defined by points P1 to P4 defined by the height 1200 of the support pin 120 and the temperature 1300 of the chamber 10. Referring to FIG. 9, in which the horizontal axis corresponds to the height of the support pin 120 and the vertical axis corresponds to the temperature of the chamber 10, points P1 to P4 corresponding to the height 1200 of the support pin 120 and the temperature 1300 of the chamber 10 included in the pre-matching data 1000 are defined. An inner region of a line connecting the points P1 to P4 is defined as an internal division (ID) region, and the outside of the internal division (ID) region is defined as an external division (ED) region. The processor 310 may determine whether a measured point SP1 corresponding to process data (the height of the support pin 120 measured in the chamber 10 and the temperature of the chamber 10) is included in the internal division (ID) region. The internal division (ID) region may be set by a convex hull algorithm or a concave hull algorithm. Each of the convex hull algorithm and the concave hull algorithm is an algorithm that generates a region including random points. The convex hull algorithm tends to overestimate the internal division (ID) region, whereas the concave hull algorithm may generate the internal division (ID) region by inputting appropriate parameters.

Figure 8:
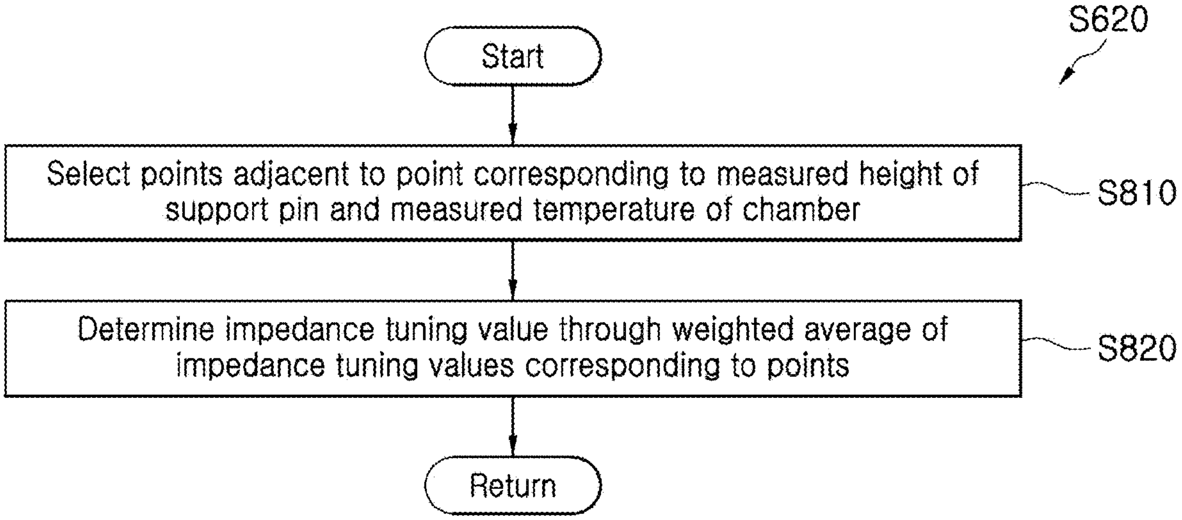
FIG. 8 is a flowchart showing a process for determining an impedance tuning value corresponding to the process data through regression analysis.

In step S620, if the process data is included in the internal division (ID) region of the pre-matching data 1000, the processor 310 determines an impedance tuning value corresponding to the process data through regression analysis of the pre-matching data 1000. FIG. 8 is a flowchart showing a process for determining an impedance tuning value corresponding to the process data through regression analysis. The step of determining an impedance tuning value corresponding to the process data through regression analysis of the pre-matching data 1000 (S620) includes a step of selecting points P1 to P4 adjacent to the measured point SP1 corresponding to the measured height of the support pin 120 and the measured temperature of the chamber 10 (S810) and a step of determining an impedance tuning value through the weighted average of impedance tuning values corresponding to the points P1 to P4 adjacent to the measured point (S820).

Referring to FIG. 9, in step S901, existing matched data (pre-matching data) is stored in the memory 320, and initial impedance adjustment of the tuner circuit 290 using pre-matching data 1000 is performed. When microwaves are applied to the chamber 10 by the microwave power supply 270, a sensor value (process data) included in the internal division (ID) region is acquired in step S902. In this case, impedance matching of the tuner circuit 290 is performed by regression analysis based on the pre-matching data. At this time, the current impedance tuning value may be determined by selecting points P1 to P4 adjacent to the measured point SP1 corresponding to the measured process data and calculating the weighted average of the impedance tuning values of the points. In this case, the weight for calculating the weighted average may be determined based on the distance between each of the points P1 to P4 and the measured point SP1. In step S903, the impedance tuning value thus determined may be added to the pre-matching data and stored in the memory 320.

In step S630, if the process data is included in the external division (ED) region of the pre-matching data 1000, the processor 310 determines an impedance tuning value of the tuner circuit 290 at which reflected power is minimized by measuring the reflected power from the chamber 10. If the measured process data deviates from the range of the pre-matching data 1000, the processor 310 may calculate an impedance tuning value based on the measurement of the reflected power in the same manner as the conventional matching method. Referring to FIG. 10, in step S1001, existing matched data (pre-matching data) is stored in the memory 320, and initial impedance adjustment of the tuner circuit 290 using pre-matching data 1000 is performed. When microwaves are applied to the chamber 10 by the microwave power supply 270, a sensor value (process data) included in the external division (ED) region is acquired in step S1002. If the measured point SP2 corresponding to the acquired process data is not included in the internal division (ID) region but is included in the external division (ED) region, the processor 310 may calculate an impedance tuning value based on the measurement of the reflected power in the same manner as a the conventional matching method. In step S1003, the impedance tuning value thus determined may be added to the pre-matching data and stored in the memory 320. At this time, the internal division (ID) region is expanded to include the measured point SP2. That is, the process data included in the external division (ED) region of the pre-matching data 1000 and the impedance tuning value of the tuner circuit 290 at which the reflected power is minimized are added to the pre-matching data 1000.

In step S450, the processor 310 adjusts the impedance of the tuner circuit 290 based on the impedance tuning value determined in step S440.

Figure 11:
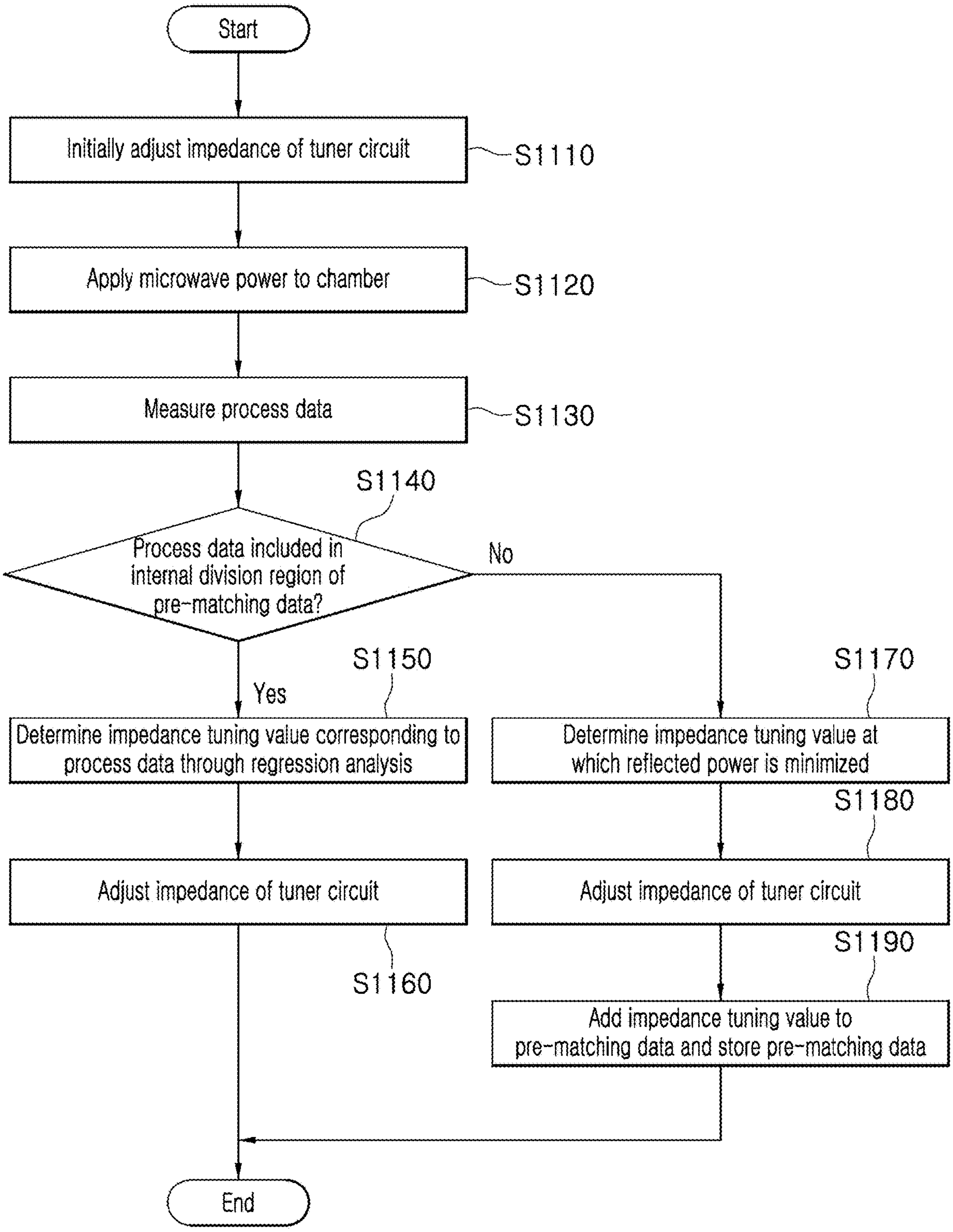
FIG. 11 is a flowchart showing an overall impedance matching and pre-matching data update process.

FIG. 11 is a flowchart showing an overall impedance matching and pre-matching data update process. The impedance matching method according to the present disclosure includes a step of initially adjusting the impedance of the tuner circuit 290 based on pre-matching data 1000 including a set of impedance tuning values corresponding to process conditions related to heat treatment stored in the memory 320 (S1110), a step of applying microwave power to the chamber 10 from the microwave power supply 270 through the tuner circuit 290 having the initially adjusted impedance (S1120), a step of measuring process data including the height of the support pin and the temperature of the chamber from the height sensor 140 and the temperature sensor 130 (S1130), a step of determining whether the point corresponding to the height of the support pin 120 measured in the chamber 10 and the temperature of the chamber is included in the internal division (ID) region set based on the points corresponding to the height of the support pin 120 and the temperature of the chamber 10 included in the pre-matching data (S1140), a step of, if the process data is included in the internal division (ID) region of the pre-matching data 1000, determining an impedance tuning value corresponding to the process data through regression analysis of the pre-matching data 1000 (S1150), a step of, if the process data is included in the external division (ED) region of the pre-matching data 1000, determining an impedance tuning value of the tuner circuit 290 at which reflected power is minimized by measuring the reflected power from the chamber 10 (S1170), a step of performing control such that the impedance of the tuner circuit 290 is adjusted based on the impedance tuning value (S1160 and S1180), and a step of, if the process data is included in the external division (ED) region of the pre-matching data 1000, adding the process data included in the external division (ED) region of the pre-matching data 1000 and the impedance tuning value of the tuner circuit 290 at which the reflected power is minimized to the pre-matching data 1000 and storing the pre-matching data 1000 having the impedance tuning value added thereto in the memory 320 (S1190).

Figure 12:
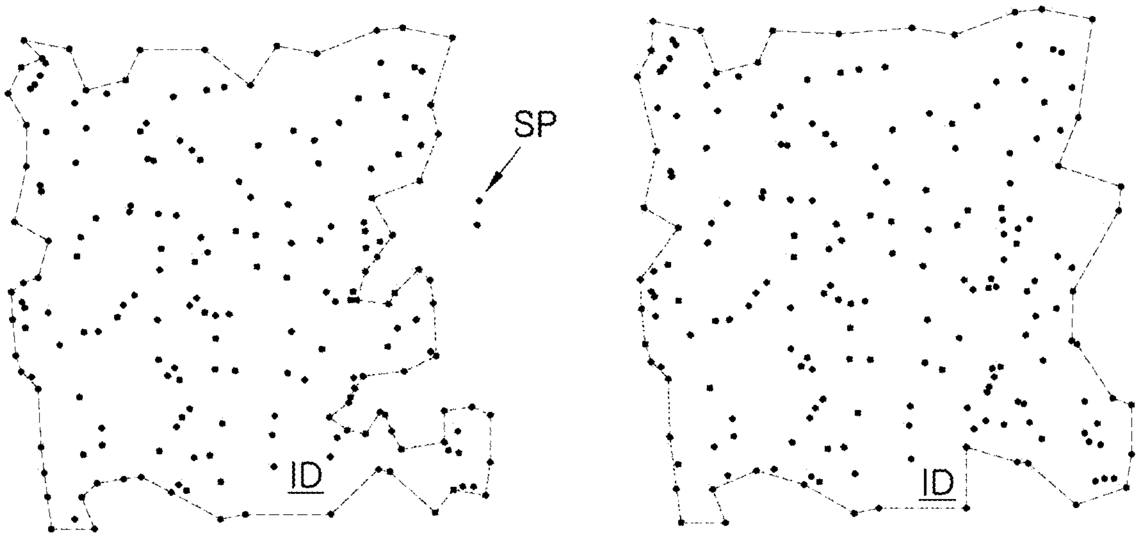
FIG. 12 is a view illustrating a process for updating the pre-matching data.

FIG. 12 is a view illustrating a process for updating the pre-matching data 1000. Referring to FIG. 12(*a*), in the existing pre-matching data 1000, the internal division (ID) region is formed by impedance tuning values for the frequency 1100, the height 1200 of the support pin 120, and the temperature 1300 of the chamber 10. If the point SP of the measured process data does not belong to the internal division (ID) region, as shown in FIG. 12(*a*), an impedance tuning value newly calculated from the process data is stored in the pre-matching data 1000. At this time, as shown in FIG. 12(*b*), the internal division (ID) region of the updated pre-matching data 1000 includes the point SP corresponding to the added process data.

As is apparent from the above description, according to the present disclosure, it is possible to quickly achieve impedance matching by initially adjusting the impedance of the tuner circuit in advance using the pre-matching data and subsequently readjusting the impedance based on the result of comparison between the measured process data and the pre-matching data.

The effects of the present disclosure are not limited to the aforementioned effect, and other unmentioned effects will be clearly understood by a person having ordinary skill in the art to which the present disclosure pertains from the above description.

It will be appreciated that the above embodiments and the accompanying drawings clearly illustrate only a part of the technical ideas included in the present disclosure and that all modifications and specific embodiments that can be readily inferred by those skilled in the art within the scope of the technical ideas included in the description and drawings of the present disclosure are included within the scope of the rights of the present disclosure.

Accordingly, the idea of the present disclosure is not to be limited to the embodiments described above, and it will be understood that not only the claims hereinafter described but also all equivalents or equivalent variations thereto fall within the scope of the idea of the present disclosure.

What is claimed is:

1. An impedance matching method between a microwave power supply and a chamber in a microwave heat treatment apparatus, the impedance matching method comprising:

initially adjusting an impedance of a tuner circuit between the microwave power supply and the chamber based on pre-matching data of a heat treatment process;

applying microwave power to the chamber from the microwave power supply through the tuner circuit having the initially adjusted impedance;

measuring process data related to an impedance of the chamber to which the microwave power has been applied;

determining an impedance tuning value of the tuner circuit by comparing the process data and the pre-matching data; and adjusting the impedance of the tuner circuit based on the impedance tuning value, wherein the pre-matching data comprises a set of impedance tuning values corresponding to process conditions related to the heat treatment process, and wherein the process conditions comprise a frequency of the microwave power supply, a height of a support pin configured to support a substrate in the chamber, and a temperature of the chamber.

2. The impedance matching method according to claim 1, wherein the step of initially adjusting the impedance of the tuner circuit comprises adjusting the impedance of the tuner circuit using one of the set of impedance tuning values.

3. The impedance matching method according to claim 2, wherein the process data comprises the height of the support pin configured to support the substrate in the chamber and the temperature of the chamber.

4. The impedance matching method according to claim 3, wherein the step of determining an impedance tuning value for the tuner circuit by comparing the process data and the pre-matching data comprises:

determining whether the process data is included in an internal division region of the pre-matching data, wherein the internal division region is defined by a virtual region constructed from a plurality of data points corresponding to different process conditions in a virtual two-dimensional plane;

determining an impedance tuning value corresponding to the process data through regression analysis of the pre-matching data if the process data is included in the internal division region of the pre-matching data; and determining an impedance tuning value of the tuner circuit at which reflected power is minimized by measuring the reflected power from the chamber if the process data is included in an external division region of the pre-matching data.

5. The impedance matching method according to claim 4, wherein the step of determining whether the process data is included within a range of the pre-matching data comprises:

setting the internal division region based on data points of the pre-matching data, wherein the data points correspond to the height of the support pin and the temperature of the chamber; and determining whether the data points are included in the internal division region.

6. The impedance matching method according to claim 5, wherein the internal division region is set by a convex hull algorithm or a concave hull algorithm.

7. The impedance matching method according to claim 4, wherein the step of determining an impedance tuning value corresponding to the process data through regression analysis of the pre-matching data comprises:

selecting neighboring data points adjacent to a first data point corresponding to a measured height of the support pin and a measured temperature of the chamber, wherein the first data point and the neighboring points are included in the pre-matching data; and determining the impedance tuning value through weighted average of impedance tuning values, among the set of impedance tuning values, corresponding to the neighboring data points adjacent to the first data point.

8. The impedance matching method according to claim 4, wherein the process data included in the external division region of the pre-matching data and the impedance tuning value of the tuner circuit at which the reflected power is minimized are added to the pre-matching data.

9. A microwave heat treatment apparatus comprising:

a chamber having a treatment space defined therein;

a power supply device configured to supply thermal energy to the chamber; and a controller configured to control the power supply device, wherein the power supply device comprises:

a microwave power supply configured to provide thermal energy to the treatment space; and a tuner circuit comprising a plurality of impedance elements provided on a power path between the chamber and the microwave power supply, wherein the controller comprises:

a processor configured to adjust an output of the microwave power supply and an impedance of the tuner circuit; and a memory configured to store data related to matching of the tuner circuit, wherein the processor is configured:

to initially adjust an impedance of the tuner circuit based on pre-matching data of a heat treatment process stored in the memory;

to apply microwave power to the chamber from the microwave power supply through the tuner circuit having the initially adjusted impedance;

to measure process data related to an impedance of the chamber to which the microwave power has been applied;

to determine an impedance tuning value of the tuner circuit by comparing the process data and the pre-matching data; and to adjust the impedance of the tuner circuit based on the impedance tuning value, wherein the pre-matching data comprises a set of impedance tuning values corresponding to process conditions related to the heat treatment process, and wherein the process conditions comprise a frequency of the microwave power supply, a height of a support pin configured to support a substrate in the chamber, and a temperature of the chamber.

10. The microwave heat treatment apparatus according to claim 9, wherein the processor adjusts the impedance of the tuner circuit using one of the set of impedance tuning values.

11. The microwave heat treatment apparatus according to claim 10, wherein the process data comprises the height of the support pin configured to support the substrate in the chamber and the temperature of the chamber.

12. The microwave heat treatment apparatus according to claim 11, wherein the processor is configured:

to determine whether the process data is included in an internal division region of the pre-matching data, wherein the internal division region is defined by a virtual region constructed from a plurality of data points corresponding to different process conditions in a virtual two-dimensional plane;

to determine an impedance tuning value corresponding to the process data through regression analysis of the pre-matching data if the process data is included in the internal division region of the pre-matching data; and to determine an impedance tuning value of the tuner circuit at which reflected power is minimized by measuring the reflected power from the chamber if the process data is included in an external division region of the pre-matching data.

13. The microwave heat treatment apparatus according to claim 12, wherein the processor is configured:

to set the internal division region based on data points of the pre-matching data, wherein the data points correspond to the height of the support pin and the temperature of the chamber; and to determine whether the data points are included in the internal division region.

14. The microwave heat treatment apparatus according to claim 13, wherein the internal division region is set by a convex hull algorithm or a concave hull algorithm.

15. The microwave heat treatment apparatus according to claim 12, wherein the process data included in the external division region of the pre-matching data and the impedance tuning value of the tuner circuit at which the reflected power is minimized are added to the pre-matching data.

16. A microwave heat treatment apparatus comprising:

a chamber having a treatment space for a substrate defined therein;

a power supply device configured to supply thermal energy to the chamber; and a controller configured to control the power supply device, wherein the power supply device comprises:

a microwave power supply configured to provide thermal energy to the treatment space; and a tuner circuit comprising a plurality of impedance elements provided on a power path between the chamber and the microwave power supply, wherein the chamber comprises:

a chuck installed at a lower part of the chamber;

a support pin installed above the chuck, the support pin being configured to support the substrate;

a temperature sensor configured to measure a temperature in the chamber; and a height sensor configured to measure a height of the support pin, wherein the controller comprises:

a processor configured to adjust an output of the microwave power supply and an impedance of the tuner circuit; and a memory configured to store data related to matching of the tuner circuit, and wherein the processor is further configured:

to initially adjust an impedance of the tuner circuit based on pre-matching data comprising a set of impedance tuning values corresponding to process conditions related to heat treatment process stored in the memory, the process conditions comprising a frequency of the microwave power supply, a height of the support pin configured to support the substrate in the chamber, and a temperature of the chamber;

to apply microwave power to the chamber from the microwave power supply through the tuner circuit having the initially adjusted impedance;

to measure process data comprising the height of the support pin and the temperature of the chamber from the height sensor and the temperature sensor;

to determine whether a point corresponding to the height of the support pin measured in the chamber and the temperature of the chamber is included in an internal division region set based on data points of the pre-matching data, wherein the data points correspond to the height of the support pin and the temperature of the chamber included in the pre-matching data, wherein the internal division region is defined by a virtual region constructed from a plurality of data points corresponding to different process conditions in a virtual two-dimensional plane;

to determine an impedance tuning value corresponding to the process data through regression analysis of the pre-matching data if the process data is included in the internal division region of the pre-matching data;

to determine an impedance tuning value of the tuner circuit at which reflected power is minimized by measuring the reflected power from the chamber if the process data is included in an external division region of the pre-matching data;

to adjust the impedance of the tuner circuit based on the impedance tuning value; and to add the process data included in the external division region of the pre-matching data and the impedance tuning value of the tuner circuit at which the reflected power is minimized to the pre-matching data and to store the pre-matching data having the impedance tuning value added thereto in the memory if the process data is included in the external division region of the pre-matching data.

* * * * *